United States Patent
Mar

(10) Patent No.: US 6,525,593 B1
(45) Date of Patent: Feb. 25, 2003

(54) METHOD AND APPARATUS FOR LOCAL AND GLOBAL POWER MANAGEMENT IN A PROGRAMMABLE ANALOG CIRCUIT

(75) Inventor: Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/935,454

(22) Filed: Aug. 22, 2001

Related U.S. Application Data

(60) Provisional application No. 60/243,708, filed on Oct. 26, 2000.

(51) Int. Cl.$^7$ ................................................ H01J 19/82
(52) U.S. Cl. ........................................................ 327/530
(58) Field of Search .................................. 327/530, 534, 327/560, 561, 562, 563, 564, 565

(56) References Cited

U.S. PATENT DOCUMENTS 6,445,221 B1 * 9/2002 Poss ............................ 326/89

* cited by examiner

Primary Examiner—Jeffrey Zweizig
(74) Attorney, Agent, or Firm—Wagner, Murabito & Hao LLP

(57) ABSTRACT

A method and apparatus for local and global power management in a programmable analog circuit. Specifically, the present invention describes an array of programmable analog blocks. Each block contains current mirror circuits that are coupled in parallel fashion. The mirror circuits function to increase current consumption in a corresponding operational amplifier more current when enabled. Global power management is achieved by increasing and decreasing the bias voltage that is applied to the array. Global configuration bits select the bias voltage value, including electrically disabling the bias voltage from the array of programmable analog blocks. Local power management is provided by enabling or disabling mirror circuits with local configuration bits to adjust the performance in an operational amplifier contained within a corresponding programmable analog block. A microcontroller controls the local and global management of power through the programmable analog block.

24 Claims, 7 Drawing Sheets

METHOD AND APPARATUS FOR LOCAL AND GLOBAL POWER MANAGEMENT IN A PROGRAMMABLE ANALOG CIRCUIT

RELATED U.S. APPLICATION

This application claims priority to the co-pending provisional patent application, Serial No. 60/243,708, entitled "Advanced Programmable Microcontroller Device," with filing date Oct. 26, 2000, and assigned to the assignee of the present invention.

BACKGROUND OF THE INVENTION

1. Field of the Invention

The present invention relates to the field of power management. More specifically, the present invention relates to the field of local and global power management in a programmable analog circuit.

2. Related Art

A microcontroller is a highly integrated chip having all or most of the necessary components to control some process or aspect in a circuit. For example, the microcontroller typically includes a central processing unit (CPU), random access memory (RAM), read only memory (ROM), input/output (I/O) interfaces, timers, and interrupt controller. The typical microcontroller has bit manipulation instructions, easy and direct access to I/O interfaces, and quick and efficient interrupt processing. By including only features specific to the task of the microcontroller and integrating the functionality onto a single chip, the cost to produce the microcontroller can be drastically reduced.

Programmable analog circuit designs for microcontrollers allow a user limited programmability to vary circuit parameters or the underlying topology of the programmable analog circuit. For example, a programmable analog circuit may be comprised of interconnected analog blocks set in a fixed topology that has programmable parameters, such as filter bandwidth or roll-off, that can be set and changed according to application needs. While the signal processing path and basic functionality of the analog circuit remains unchanged, some programmable functionality is introduced by letting parameters vary in the programmable analog circuit.

A particular functionality important to programmable analog circuit designs is power management. Power management is particularly important in light of the movement towards lower voltage levels needed to accommodate the ever decreasing size of circuit components. As end products become more lightweight, smaller, and more portable, the requirement for three volt and lower microcontrollers allows for less power consumption and longer battery life. However, in the past, designing the proper analog circuitry for lower power consumption was difficult to achieve without sacrificing operating performance. As a result, microcontrollers previously offered limited power management functionality.

Previous methods for controlling power using analog circuits reduced the overall performance capabilities of the programmable circuit. Programmable analog circuit blocks include basic programmable operational amplifier circuits used for many functionalities including gain amplifiers, switch capacitor integrators, analog to digital (A/D) converters, digital to analog (D/A) converters, filters, etc. In addition, a switched capacitor integrator forms the basis for an analog processing unit that can support A/D and D/A digital converters, comparators, programmable gain amplifiers, and filters.

One method implemented in the past for controlling power management throughout a programmable analog circuit included increasing or decreasing the bias voltage. The bias voltage drives the operational amplifier in the programmable analog circuit. Increasing the bias supply voltage does increase the speed of the operational amplifier and the overall circuit; however, the improvement comes at a cost of performance.

Increasing the bias voltage increases the current through the operational amplifier in the programmable analog circuit. More current increases the slew rate of the circuit and increases the circuits ability to overcome the load capacitance in the circuit. This allows the operational amplifier to run faster resulting in better performance.

However, there is a tradeoff. By increasing the bias voltage, the dynamic range of the operational amplifier is reduced. Basically, the dynamic range of the output voltage is clipped or reduced for the analog circuit containing the operational amplifier. As a result, increasing the bias voltage negatively decreases the dynamic range of the circuit containing the operational amplifier.

Conversely, to maintain the dynamic range, the bias voltage must be reduced. However, at low bias levels (and hence lower supply voltages, such as, three volts), the circuit containing the operational amplifier operates at much slower speeds.

Thus, a need exists to provide a degree of programmability to power management in a programmable analog circuit. Another need exists to provide increased speeds in a programmable analog circuit without sacrificing performance.

SUMMARY OF THE INVENTION

The present invention discloses a method and system for power management in a programmable analog circuit. The present invention provides for a degree of programmability in the management of power in a programmable analog circuit. Also, the present invention meets the above need and provides for increased speeds in a programmable analog circuit without sacrificing performance.

These and other objects and advantages of the present invention will no doubt become obvious to those of ordinary skill in the art after having read the following detailed description of the preferred embodiments which are illustrated in the various drawing figures.

The present invention discloses a method and system for local and global power management in a programmable analog circuit. Specifically, one embodiment of the present invention describes an array of programmable analog circuit blocks, wherein each block contains an operational amplifier circuit component. In each programmable analog circuit block, there are duplicate current mirror circuits that are coupled in parallel fashion. These current mirrors drive the operational amplifier circuit component in a corresponding analog circuit block. The mirror circuits function to consume more current when enabled, thereby increasing the speed of the operational amplifier component in the analog circuit block.

Global power management is achieved by increasing and decreasing the bias voltage that is applied to each analog circuit block in the array, in accordance with another embodiment of the present invention. Global configuration control bits select between the various bias voltages available. Increasing the bias voltage increases current through the programmable analog circuit blocks. Correspondingly, an increase in speed of the entire circuit is effected.

In another embodiment, the global configuration control bits can select to electrically disable the bias voltage to the array of programmable analog circuit blocks. Switches selected by the global configuration control bits either provide a bias voltage to each of the programmable analog circuit blocks, or quickly disable the analog block.

Local power management is provided by enabling or disabling mirror circuits with switches controlled by local configuration control bits to adjust the performance in a corresponding operational amplifier circuit contained within a programmable analog circuit block, in accordance with one embodiment of the present invention.

A microcontroller controls the global management of power through the programmable analog circuit. The same or separate microcontroller controls local management of power through each of the operational amplifiers in each of the programmable analog circuit blocks.

DETAILED DESCRIPTION OF THE INVENTION

Figure 1:
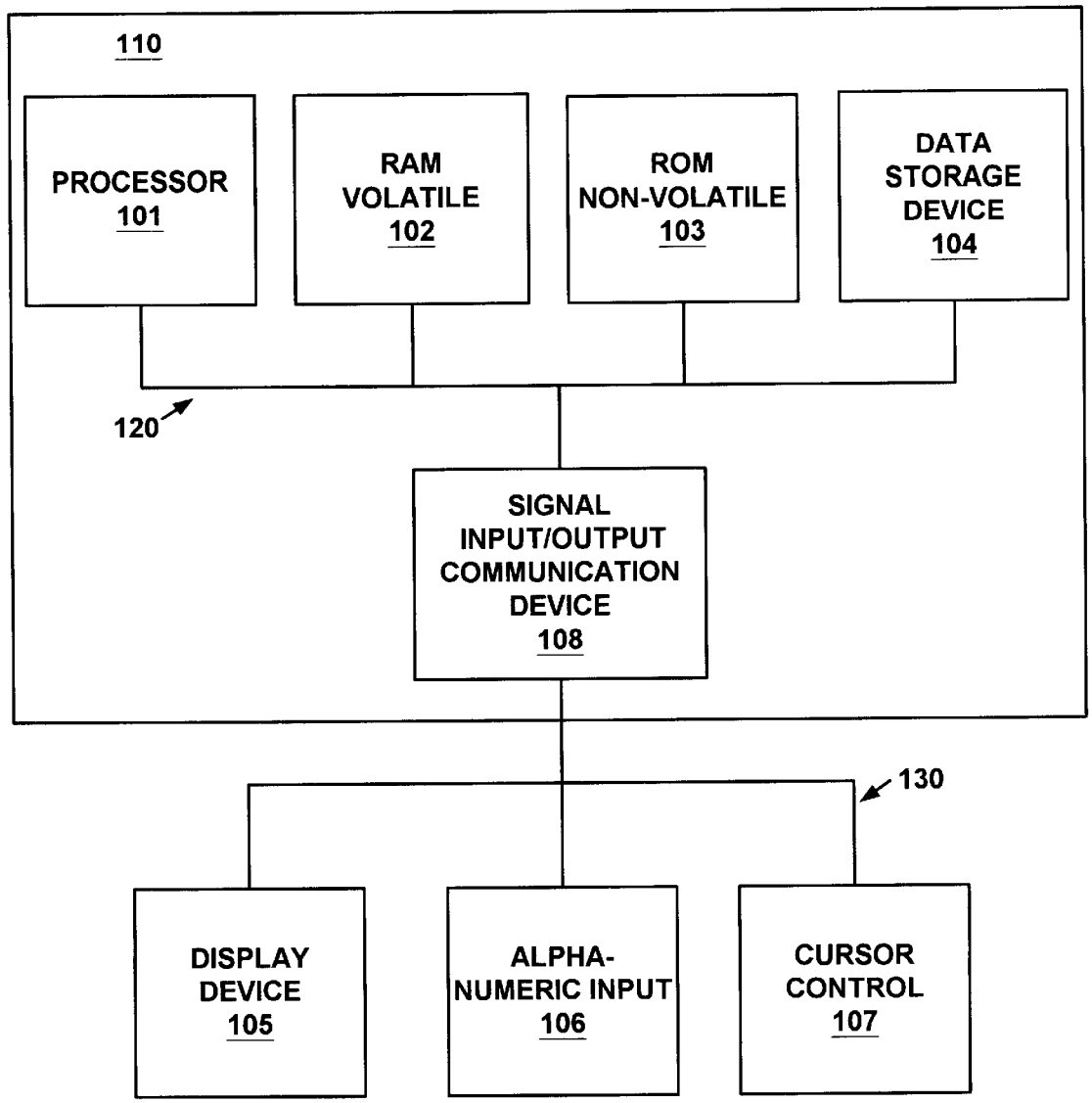
FIG. 1 is a logical block diagram of a microcontroller in accordance with an embodiment of the present invention.

Reference will now be made in detail to the preferred embodiments of the present invention, a method and system for local and global power management in a programmable analog circuit, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "accessing," or "processing," or "computing," or "translating," or "calculating," or "determining," or "scrolling," or "displaying," or "recognizing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Referring now to FIG. 1, portions of the present invention are comprised of computer-readable and computer-executable instructions which reside, for examples in computer-readable media of an electronic system, such as a microcontroller. FIG. 1 is a block diagram of exemplary interior components of an exemplary electronic system 100, which includes a microcontroller 110, upon which embodiments of the present invention may be implemented. It is appreciated that the exemplary microcontroller 110 of FIG. 1 is only exemplary and that the present invention can implement a number of different electronic systems including modems, digital to analog (D/A) converters, analog to digital (A/D) converters, power gain amplifiers, comparators, switched capacitor filters, and the like.

FIG. 1 illustrates circuitry of an exemplary computer system 100 which includes a microcontroller 100. Exemplary microcontroller 110 includes an internal address/data bus 120 for communicating information, a central processor 101 coupled with the bus 120 for processing information and instructions, a volatile memory 102 (e.g., random access memory (RAM), static RAM dynamic RAM, etc.) coupled with the bus 120 for storing information and instructions for the central processor 101, and a non-volatile memory 103 (e.g., read only memory (ROM), programmable ROM, flash memory, EPROM, EEPROM, etc.) coupled to the bus 120 for storing static information and instructions for the processor 101.

With reference still to FIG. 1, an optional signal Input/ Output device 108 which is coupled to bus 120 for providing a communication link between microcontroller 110 and a network environment is described. As such signal Input/ Output (I/O) device 108 enables the central processor unit 101 to communicate with or monitor other electronic systems or analog circuit blocks that are coupled to the microcontroller 110.

The input/output device 108 could be a I/O interface such as a serial or USB port that is associated with the bus 120. Data from the microcontroller 110 travels through the port and onto an external bus 130 that provides for data transfer between components of the electronic system 100, including microcontroller 110. In one embodiment of the present invention, external bus 130 can be a serial communication bus, such as the serial peripheral interface (hereinafter referred to as "SPI") communication bus.

For example, components of electronic device 100 could include a display device 105 coupled to the bus 130 for displaying digital images to the user. The display device 105 utilized with electronic device 100 may be a liquid crystal display (LCD) device, a cathode ray tube (CRT), a field emission display device (also called a flat panel CRT), or other display device suitable for generating graphic images and alphanumeric characters recognizable to the user.

Also included in electronic device 100 is an optional alphanumeric input device 106, in another embodiment of the present invention. Alphanumeric input device 106 can communicate information and command selections to processor 101 via bus 130 and bus 120. In one implementation, alphanumeric input device 106 is a touch screen device. Alphanumeric input device 106 is capable of registering a position where contact is made.

In still another embodiment of the present invention, electronic device 100 also includes an optional cursor control or directing device (on-screen cursor control 107) coupled to bus 130 for communicating user input information and command selections to processor 101. In one implementation, on-screen cursor control device 107 is a touch screen device incorporated with display device 105.

Local and Global Power Management of a Programmable Analog Circuit

Figure 2:
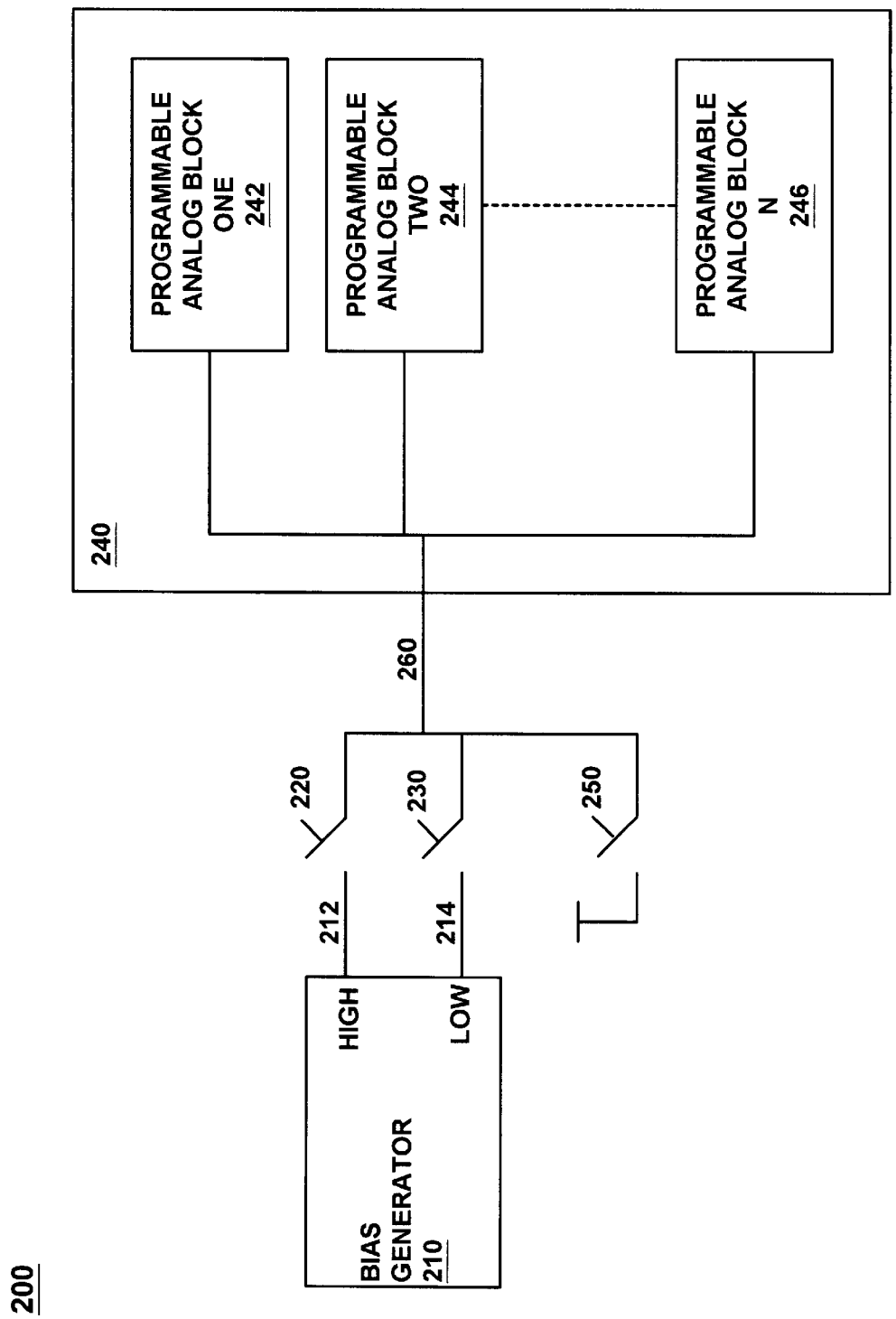
FIG. 2 illustrates a block diagram of a plurality of programmable analog circuit blocks showing global power management, in accordance with one embodiment of the present invention.

This disclosure describes a method and apparatus for local and global power management in a programmable analog circuit. Referring now to FIG. 2, a programmable analog circuit 200 is shown with a programmable analog array 240 of programmable analog blocks (e.g., programmable analog block-one 242, programmable analog block-two 244, on up to programmable analog block-N 246), in accordance with one embodiment of the present invention. Each of the programmable analog blocks, 242, 244, and 246, are coupled in parallel fashion. In addition, each of the programmable analog blocks, 242, 244, and 246, contain an operational amplifier component, and can be used to implement numerous functionalities, such as D/A converters, A/D converters, power gain amplifiers, comparators, switch capacitor filters, etc.

FIG. 2 illustrates the global power management technique implemented by the analog circuit 200. Global power management gives architectural level control of the analog circuit 200. A bias generator 210 is coupled to the programmable analog array 240 of programmable analog blocks 242, 244, and 246 via the global bias line 260. The global bias line 260 is connected to switches 220, 230, and 250 to provide various options for the programmable analog array 240.

Two bias lines are shown in FIG. 2 coming out of the bias generator 210. The generator 210 provides two voltage levels available to the programmable analog array 240 of programmable analog blocks. A high voltage bias line 212 and low voltage bias line 214 are shown coming from the bias generator 210. Although only two voltage levels are recited in the present embodiment, the present invention is also well suited to an embodiment in which multiple bias voltage levels are provided.

To boost the bias to the programmable analog array 240, the switch 220 to the high bias line 212 is closed. Otherwise, the switch 214 to the low bias line 214 is closed for normal operation. At the high bias voltage level, the programmable analog array 240 operates at higher speeds; however, more power is consumed and the dynamic range for the operational amplifier in each of the blocks 242, 244, and 246 is reduced. At the lower bias level, less power is consumed and the dynamic range for the operational amplifier in each of the blocks 242, 244, and 246 is increased, but the overall speed of the programmable analog array 240 is slower when compared to the higher bias voltage.

Referring back to FIG. 2, circuit 200 also implements another switch 250 which, when closed, electrically disables the programmable analog array 240, in other words, completely shuts down analog circuit 200.

Global configuration bits are used to control the switches 220, 230, and 250, in accordance with one embodiment of the present invention. In FIG. 2, two global configuration bits are decoded to map signals for controlling the switches 220, 230, and 250. One global bias bit controls the switching between the high bias voltage line 212 and the low bias voltage line 214.

The second bit shuts down the programmable analog array 240. When asserted, the second bit overrides the high and low bias voltage levels and forces switch 250 to close, which fully powers down the programmable analog array 240.

On the other hand, shutting down individual operational amplifiers inside each of the programmable analog blocks (e.g., blocks 242, 244, and 246) would require an additional control bit for each block. In order to shut down the programmable analog array 240, each individual block (e.g., 242, 244, and 246) of the array 240 would have to be separately shut down, thereby increasing the processing time and response time to shut down the array 240. Implementation of the switch 250 allows for quick response in shutting down the array 240 with the assertion of just one global power bit.

Figure 3:
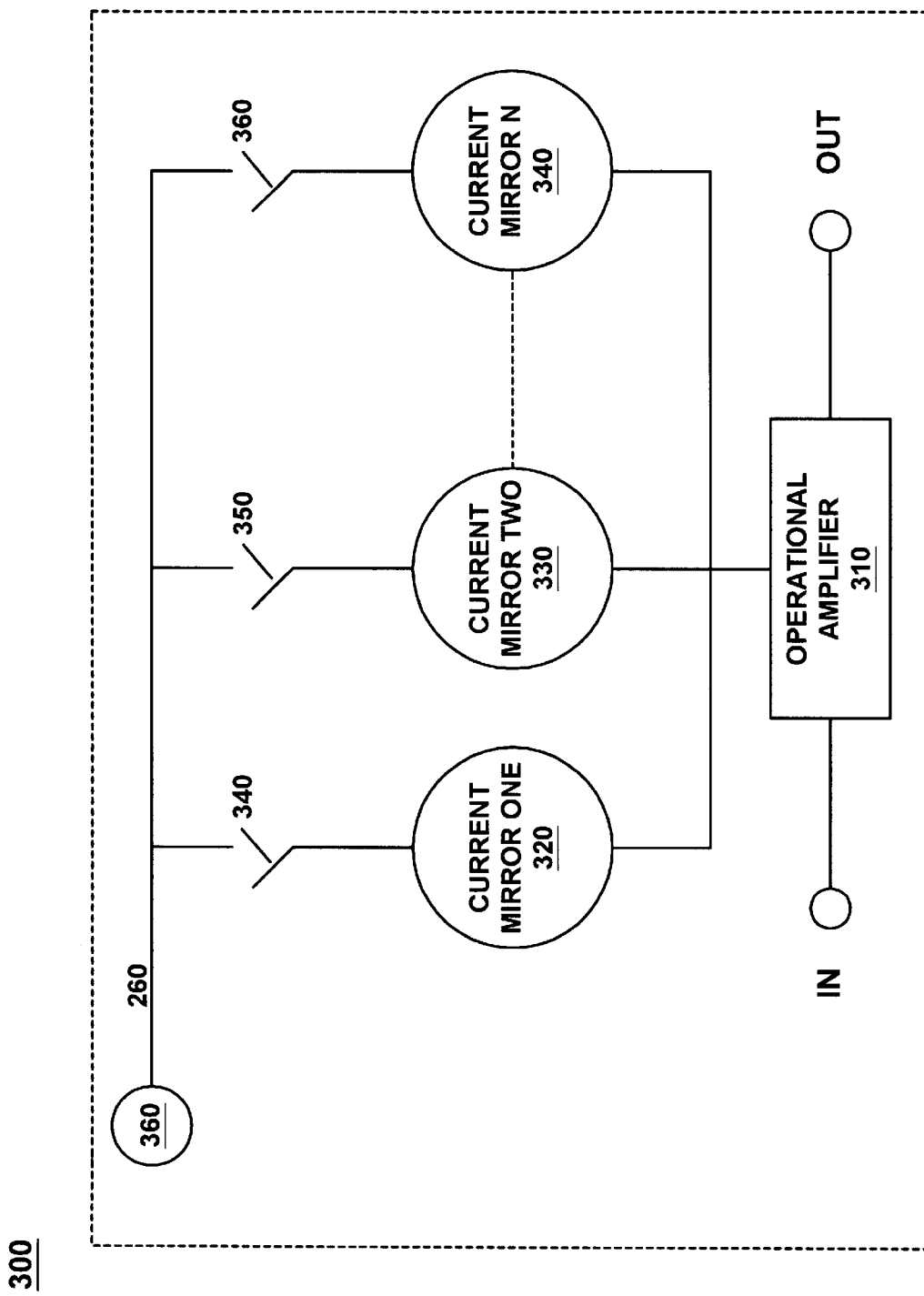
FIG. 3 illustrates a block diagram of one programmable analog circuit block showing local power management, in accordance with one embodiment of the present invention.

FIG. 3 illustrates a block diagram of one programmable analog block 300 showing local power management, in accordance with one embodiment of the present invention. Block 300 is a programmable analog block and is exemplary of the programmable analog blocks 242, 244, and 246 in the programmable analog array 240 of FIG. 2.

Local power management of each of the blocks in the array 240 of programmable analog blocks that include operational amplifiers, allows for incremental power management over the array 240.

Referring back to FIG. 3, an operational amplifier 310 is at the center of the programmable analog block 300. A bias voltage (not shown) is applied to node 360 to run the operational amplifier 310. The global bias line 260, as shown in FIG. 2, is coupled to node 360. Although embodiments of the present invention describe a current mirror or current source, other embodiments are well suited to other available types of power sources.

Programmable analog block 300 provides incremental power management of the operational amplifier 310 through the mirror circuits that are coupled in parallel. In this present case, increasing current through the operational amplifier 310 to increase the speed of the operational amplifier is not achieved by increasing the bias supply voltage, necessarily, but by introducing parallel current mirror circuits (e.g., current mirror-one 320, current mirror-two 330, on up to current mirror-n 340), in accordance with one embodiment of the present invention. In addition, these parallel current mirror sources increase the speed of the operational amplifier 310 without any of the deleterious effects on the dynamic range of the programmable analog block 300.

The parallel current mirrors allows the programmable analog block to operate at faster speeds at lower bias voltages, and at lower power levels. Since the circuit is driven by a lower bias voltage, the dynamic range of the circuit is higher. Also, the addition of parallel current sources increases the speed through the operational amplifier 310 thereby increasing the slew rate for overcoming load capacitance, and increasing the operating speed of the operational amplifier.

The operational amplifier circuit 300 as shown in FIG. 3 is exemplary only and can accommodate numerous parallel mirrors as indicated by current mirror-n 340. The current mirrors (e.g., mirror-one 320, mirror-two 330, and mirror-n 340) are controlled by local configuration bits. The local configuration bits controls signals going to the switches 340, 350, and 360. Each of the switches couples its corresponding current mirror to the global bias line 260, or alternatively shuts down the current mirror by switching away from the bias voltage. This effectively disables the current mirror from the programmable analog block 300.

In another embodiment of the present invention, the current mirrors in the programmable analog block 300 provide incremental increases in the current through the operational amplifier 310 that are in ration or multiples of one another. For example, in a programmable analog block with three current mirrors, current mirror-one 320 can provide the baseline current as provided from the bias voltage; current mirror-two 330 can have a ratio of four times the current provided by current mirror-one 320 from the bias voltage; and current mirror-n, representing the third current mirror, can have a ratio of twelve times the current provided by current mirror-one 320 from the bias voltage.

Implementation of the local power management in programmable analog block 300 is achieved by selectively removing or including each of the current mirror sources (e.g. mirrors 320, 330, and 340). As such, incremental increases in power is achieved by selecting one or more of the current mirror circuits in FIG. 3. At full power, or the maximum speed of the operational amplifier 310, all the current mirrors (e.g., 320, 330, on up to mirror 340) are coupled to operational amplifier 310 and the bias voltage at node 360. At minimum power, or the minimum speed of the operational amplifier 310, all the current mirrors (e.g., 320, 330, on up to mirror 340) are decoupled from the global bias line 260.

For example, in one embodiment of the present invention, programmable analog block 300 has only three current mirrors (e.g., mirrors 320, 330, and 340). A total of two local configuration bits are needed to control signals to the switches associated with the three current mirrors. The two local configuration bits allow for four power levels: off, low power, medium power, and high power. In the off position, none of the current mirrors 320, 330, or 340 are turned on.

In the low power position, one of the current mirrors 320, 330, or 340 is turned on (e.g., current mirror 320). In the medium power position, two of the current mirrors 320, 330, or 340 are turned on (e.g., current mirrors 320 and 330). Finally, in the high power position, all of the current mirrors 320, 330, and 340 are turned on.

Although a ratio of 1:4:12 is recited in the present embodiment, the present invention is also well suited to an embodiment in which other ratios are used, and/or a varying number of current mirrors are used to give incremental local power management of the operational amplifier in circuit 300.

Figure 7:
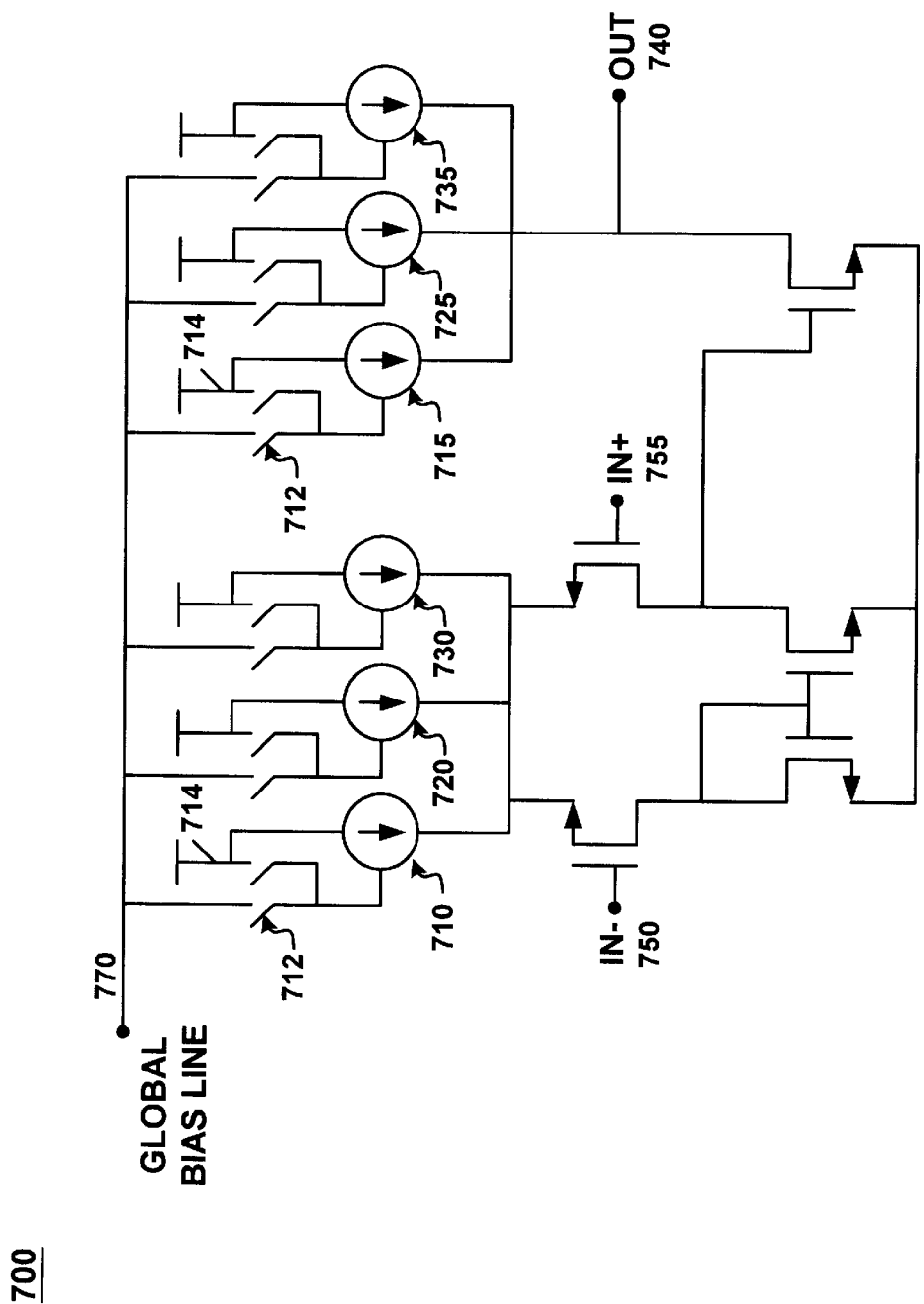
FIG. 7 illustrates a block diagram of a programmable analog circuit block with operational amplifier characteristics, in accordance with one embodiment of the present invention.

FIG. 7 illustrates a more detailed block diagram of a programmable analog block 700 that includes a basic operational amplifier circuit, in accordance with one embodiment of the present invention. A plurality of current sources are contained within the programmable analog block 700.

The operational amplifier in programmable analog block 700 is in two stages, an input stage and output stage. Current sources drive both stages. In the present embodiment, the current sources are paired together. One of each pair of current sources is coupled to the transistors coupled to the input voltages at node 750 ($-V_{in}$) and node 755 ($+V_{out}$). The other of each pair of current sources, or current mirrors, is coupled to the output voltage at node 740. In one embodiment, in one pair of current sources, the currents in both stages are mirrored and are related by an integer multiple.

The current sources coupled to the transistors at the input voltages at nodes 750 and 755 are coupled in parallel. In addition, the current sources coupled to the output voltage at node 740 are coupled in parallel.

In the present embodiment, the programmable analog block 700 shows three pairs of current mirrors driving the operational amplifier circuit. The first pair of current mirrors contains current source 710 and current source 715. The second pair of current mirrors contains current source 720 and current source 725. The third pair of current mirrors contains current source 730 and current source 735.

Switches control each pair of current mirrors. For example, for the first pair of current mirrors, the switches 712 and 714 represent control of the current sources 710 and 715. If the switches 714 to the power supply (not shown) is enabled, then the current sources 710 and 715 are turned off. If the switches 712 to the global bias line 770 is enabled, the current sources 710 and 715 are turned on. The current level in each of the current sources 710 and 715 is determined by the voltage on the bias line 770. The remaining pairs of current mirrors are similarly enabled and disabled.

Also, the current sources in each pair of current mirrors are controlled in similar fashion. For example, if current source 710 is on, then current source 715 is also on, as they make up a pair of current mirrors. As such, a single signal controls the switches that control both current sources in each pair of current mirrors.

In addition, the switches for each pair of current sources are complementary. For example, the switches 712 and 714, that control the current sources 710 and 715, are complementary: if one switch is one, the other switch must be off. Thus, if switch 712 is on, then switch 714 is off. As such, a single complementary signal can control both switches.

Local management of power control in programmable analog block 700 is controlled by 2 decoded bits in the current embodiment. The two bits can be decoded into four control lines. The four control lines provide the ability to enable the corresponding switches in each pair of current mirrors to turn on one, two, or three pairs of current sources at the same time. Additionally one of the control lines can disable the corresponding switches in each pair of current mirrors to turn off all three pairs of current mirrors at the same time.

Figure 4:
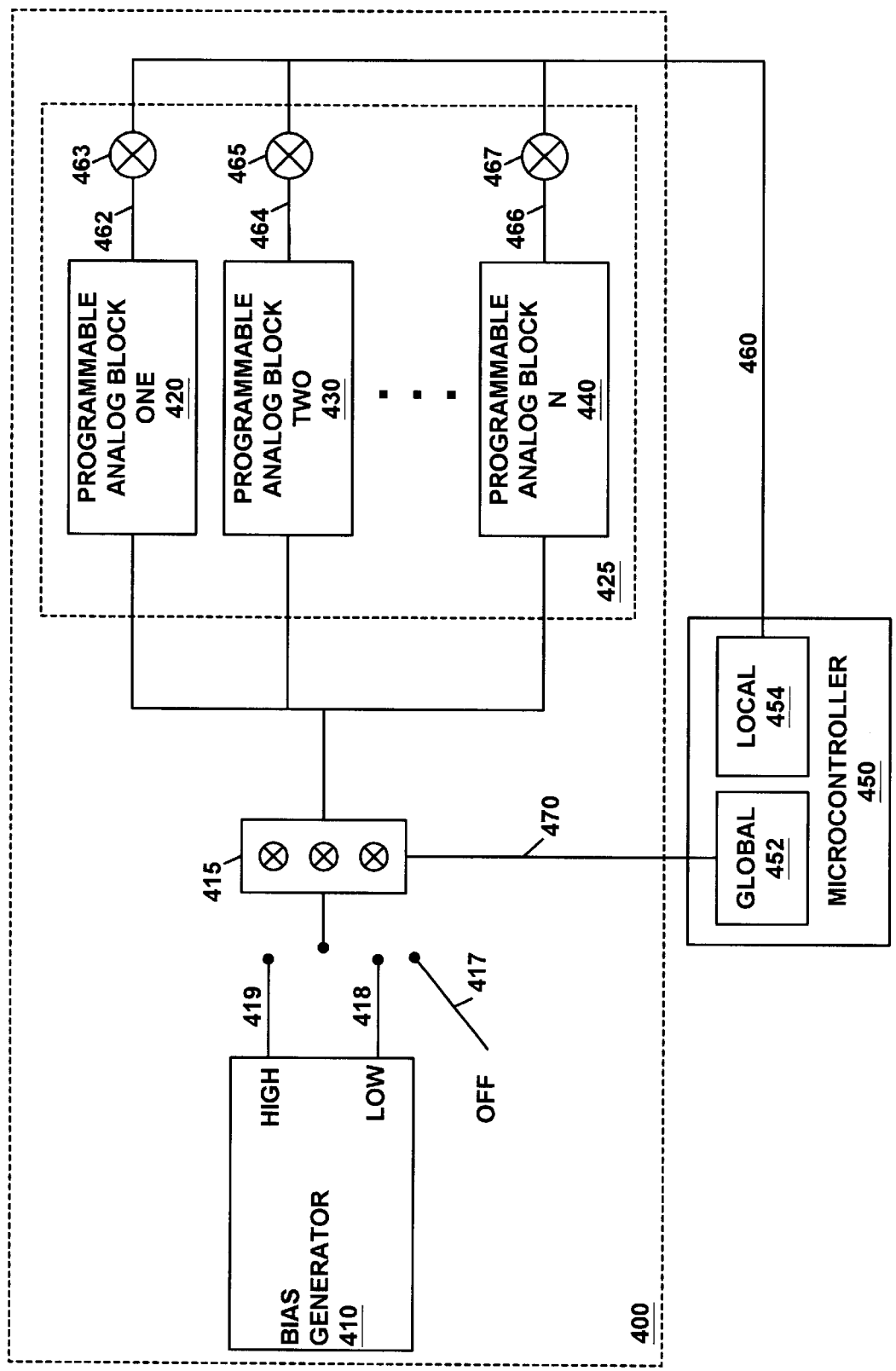
FIG. 4 illustrates a block diagram showing a microcontroller with local and global power management functionality over an array of programmable analog circuit blocks, in accordance with an embodiment of the present invention.

FIG. 4 illustrates a block diagram showing a microcontroller 450 with local and global power management functionality over a programmable analog circuit 400, in accordance with an embodiment of the present invention. The programmable analog circuit 400 includes a bias generator 410 and a programmable analog array 425 of programmable analog blocks. Each of the programmable analog blocks contain an operational amplifier. Although a single microcontroller is recited in the present embodiment, the present invention is also well suited to an embodiment in which two or more microcontrollers can be used to implement local and global power management in the programmable analog circuit 400.

Microcontroller 450 provides two levels of architectural control over programmable analog circuit 400: global power control 452 and local power control 454. The global power control 452 uses global configuration bits to select the switches in control box 415 to each of the bias lines from bias generator 410 or select to shut down the array 425 of programmable analog blocks.

The global configuration bits over control line 470 can select to shut down the entire programmable analog array 425. In order to shut down the programmable analog array 425, the global configuration bits select the switch to the "off" line 417 effectively powering down the programmable analog array 425.

The global power control 452 can also present a bias voltage from bias generator 410 to each of the programmable analog blocks that each contain operational amplifiers (e.g., block-one 420, block-two 430, on up to block-n 440), as shown by control line 470. The global configuration bits control signals that present a bias voltage to the blocks (e.g., blocks 420, 430, and 440). The bias voltage has two levels as represented by the high bias voltage line 419 and the low bias voltage line 418.

Local power control 454 of microcontroller 450 implements local power management of each of the programmable analog blocks that contain operational amplifiers (e.g., block-one 420, block-two 430, on up to block-n 440). Local power bits to each of the programmable analog blocks in the array 425 control the switches to each of the current mirrors (not shown) in the programmable analog blocks 420, 430, on up to 440. The local power bits are asserted over control line 460 through each of the local control lines.

The switches 463, 465, on up to switch 467 control the current mirrors in the corresponding programmable analog block. For example, the local control bits over local line 462 control the switches, as shown generally in switch 463, to each of the current mirrors in programmable analog block one 420. The local control bits over local line 464 control the switches, as shown generally in switch 465, to each of the current mirrors in programmable analog block two 430. The local control bits over local line 466 control the switches, as shown generally in switch 467, to each of the current mirrors in programmable analog block N 440.

Moreover, each of the programmable analog blocks (e.g. programmable analog block-one 420, block-two 430, on up to block-three 440 can be identical in accordance with one embodiment of the present invention. In another embodiment, each of the operational amplifier blocks can also provide different ratios of power adjustment through the implementation of current mirror sources, and provide varying numbers of current mirror sources.

Figure 5:
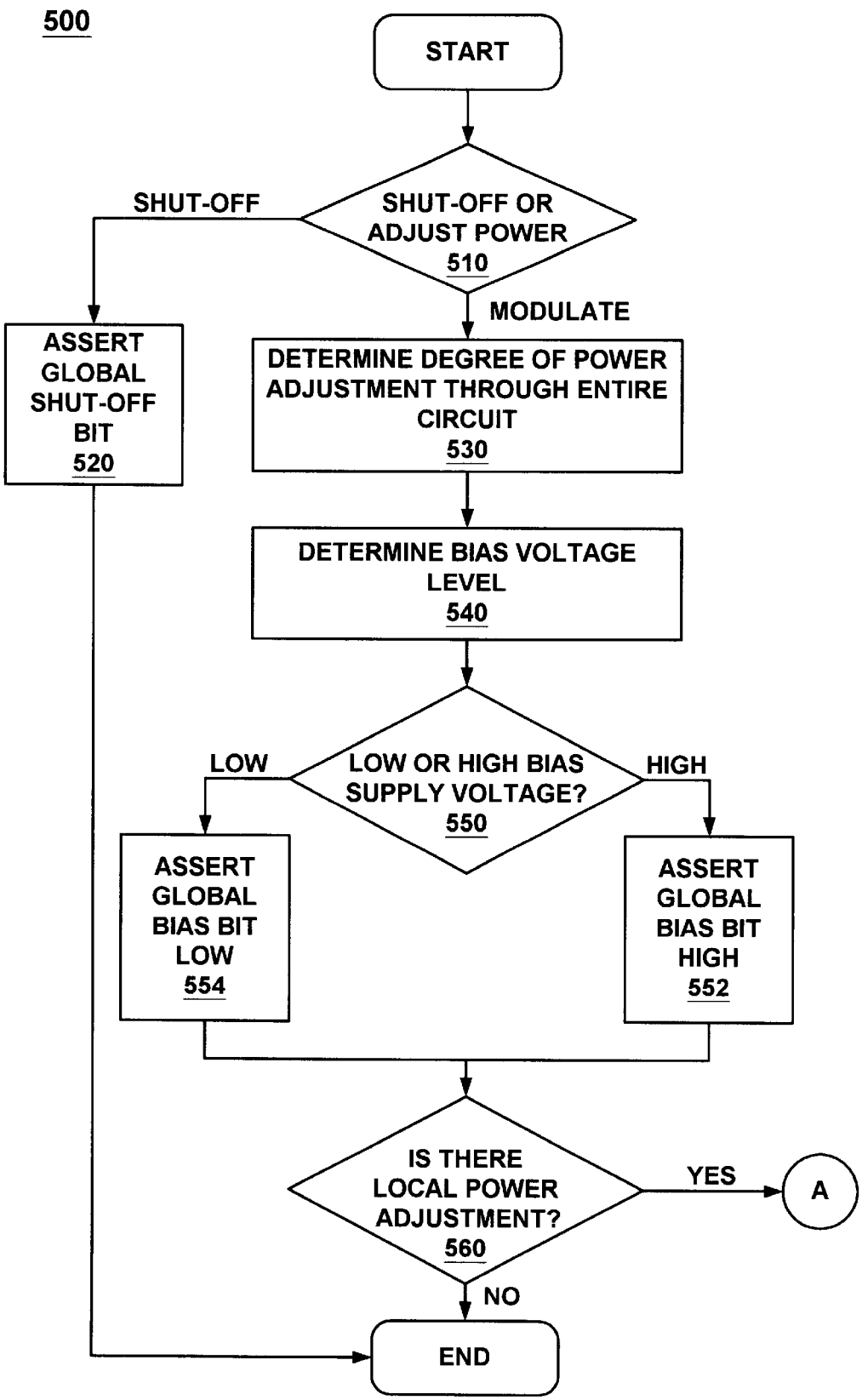
FIG. 5 is a flow diagram illustrating steps in a computer implemented method for global power management in a programmable analog circuit block, in accordance with an embodiment of the present invention.

FIG. 5 illustrates a flow chart 500 of steps for process 500 showing global power management of a programmable analog circuit that contains an array of programmable analog blocks, in accordance with an embodiment of the present invention. Flow chart 500 shows that the present embodiment selects between shutting down the entire array of programmable analog blocks or adjusting the power through the array of programmable analog blocks in step 510. If the decision is made to shut off power to the entire array of programmable analog blocks, the present embodiment asserts the global shut off bit in step 520. This effectively shuts down the bias generator so that the array of programmable analog blocks is not driven by a bias voltage.

On the other hand, if the decision is made to adjust power through the array of programmable analog blocks, then the degree of adjustment is determined through the entire programmable analog circuit in step 530. In step 540, the present embodiment determines the bias voltage level necessary to achieve the degree of adjustment of the power level through the entire programmable analog circuit, namely the array of programmable analog blocks.

Continuing with flow chart 500, the present embodiment in FIG. 5 selects between the low or high bias voltages. If the lower bias voltage is selected, the present embodiment asserts the global bias bit low in step 554. On the other hand, if the higher bias voltage is selected, the present embodiment asserts the global bias bit high in step 552.

It is appreciated that embodiments of the present invention are well suited to combinations of a plurality of global configuration bits that control bias voltages with more than two selections. As such, another embodiment of the present invention asserts a plurality of global configuration bits for controlling the bias voltage going to the array of programmable analog blocks. Each of the programmable analog blocks are coupled in parallel.

For example, in step 552, the present embodiment asserts a combination of a plurality of global configuration bits for increasing the bias voltage throughout the array of programmable analog blocks.

Alternatively, the present embodiment asserts another combination of the plurality of global configuration bits for decreasing the bias voltage, in step 554. Decreasing the bias voltage includes asserting still another combination of the plurality of global configuration bits for shutting down the array of programmable analog blocks by electrically disabling the bias generator that supplies the bias voltage, as described in step 520.

In step 560 of flow chart 500, the present embodiment determines if local adjustment of each of the programmable analog blocks in the array programmable analog blocks is necessary. If local adjustment is needed, then flow chart 500 proceeds to the flow chart 600 in FIG. 6 as indicated by step A. Otherwise, if local adjustment is not needed, then flow chart 500 ends.

Figure 6:
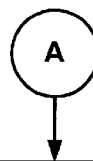
FIG. 6 is a flow diagram illustrating steps in a computer implemented method for local power management in a programmable analog circuit block, in accordance with an embodiment of the present invention.

FIG. 6 illustrates a flow chart 600 of steps for process 600 showing local power management of a programmable analog block, in accordance with an embodiment of the present invention. If local power management is necessary from step 560 of flow chart 500, then the present embodiment determines the degree of adjustment at each individual programmable analog block in step 610.

The present embodiment proceeds to step 620 to select a programmable analog block in the array of programmable analog blocks for adjusting its power level.

In step 630, the present embodiment asserts an appropriate combination of a plurality of local configuration bits in order to achieve the proper performance of the corresponding programmable analog block. Assertion of the plurality of local configuration bits control a plurality of current mirror sources which are coupled in parallel in the programmable analog block. This effectively enables a correct combination of corresponding current mirror sources in the selected programmable analog block to achieve the proper power level in the block.

In one embodiment of the present invention, a combination of the plurality of local configuration bits is asserted to increase the current through the corresponding operational amplifier within the programmable analog block.

In general, selection of more current mirror sources increases the amount of current in the corresponding operational amplifier within the programmable analog block. Increasing the amount of current also increases the speed of the programmable analog block, but increases the amount of power consumed by the programmable analog block.

Alternatively, selection of less current mirror sources decreases the amount of current in the corresponding operational amplifier within the programmable analog block. Decreasing the amount of current decreases the speed of the programmable analog block, but also decreases the amount of power consumed by the programmable analog block.

In step 630, a combination of the plurality of local configuration bits, associated with one block in the array of programmable analog blocks, is asserted to decrease current through the corresponding operational amplifier. Decreasing current is accomplished by selectively disabling current mirror sources in the corresponding programmable analog block. All the current mirror sources could be disabled, which effectively would electrically turn off the corresponding programmable analog block.

Proper selection and control of the available current mirror sources in each programmable analog block allow for management of the power consumed through the array of programmable analog blocks.

Continuing with flow chart 600 the present embodiment determines if other programmable analog blocks need further power level adjustment in step 640. If other programmable analog blocks in the programmable analog circuit needs power level adjusting, then the present embodiment 600 proceeds back to step 620 of flow chart 600. If no other programmable analog blocks in the programmable analog circuit need power levels adjusted, then flow chart 600 ends.

While the methods of embodiments illustrated in process 500 and 600 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

The preferred embodiment of the present invention, local and global power management in a programmable analog circuit, is thus described. While the present invention has been described in particular embodiments, it should be appreciated that the present invention should not be construed as limited by such embodiments, but rather construed according to the below claims.

What is claimed is:

1. A programmable analog circuit having global and local power management comprising:
    a first programmable analog block having a first plurality of mirror circuits coupled in parallel for adjusting performance of said first programmable analog block, including a first mirror circuit;
    a bias voltage for biasing said first programmable analog block;
    a plurality of global configuration bits for increasing said bias voltage for adjusting performance of said first programmable analog block; and
    a first plurality of local configuration bits for controlling said first plurality of mirror circuits for adjusting performance of said first programmable analog block.

2. The programmable analog circuit as described in claim 1, wherein said first programmable analog block includes a first operational amplifier.

3. The programmable analog circuit as described in claim 2, wherein said first plurality of mirror circuits is a first plurality of current mirrors coupled in parallel.

4. The programmable analog circuit as described in claim 3, further comprising:
    a first combination of said first plurality of local configuration bits for increasing current through said first operational amplifier for adjusting performance of said first programmable analog block by selectively enabling current mirrors in said first plurality of current mirrors.

5. The programmable analog circuit as described in claim 3, further comprising:
    a first combination of said first plurality of local configuration bits for decreasing current through said first operational amplifier for adjusting performance of said first programmable analog block by selectively disabling current mirrors in said first plurality of current mirrors, said first combination of said first plurality of local configuration bits including disabling all current mirrors in said first plurality of current mirrors to effectively shut down said first programmable analog block.

6. The programmable analog circuit as described in claim 3, wherein each successive current mirror in said plurality of first current mirrors provides an increase in current.

7. The programmable analog circuit as described in claim 3, further comprising:
    a second programmable analog block coupled in parallel to said to said first programmable analog block;
    a second operational amplifier contained within said second programmable analog block,
    a second plurality of current mirrors contained within said second programmable analog block that are coupled in parallel for adjusting performance of said second programmable analog block, said bias voltage biasing said second programmable analog block, said plurality of global configuration bits for increasing said bias voltage for adjusting performance of said second programmable analog block; and
    a second plurality of local configuration bits for controlling said second plurality of current mirrors, and for adjusting performance of said second programmable analog block.

8. The programmable analog circuit as described in claim 7 further comprising:
    a second combination of said second plurality of local configuration bits for increasing current through said second operational amplifier for adjusting performance of said second programmable analog block by selectively enabling current mirrors in said second plurality of current mirrors.

9. The programmable analog circuit as described in claim 7, further comprising:

a second combination of said second plurality of local configuration bits for decreasing current through said second operational amplifier for adjusting performance of said second programmable analog block by selectively disabling current mirrors in said second plurality of current mirrors, said second combination of said second plurality of local configuration bits including disabling all current mirrors in said second plurality of current mirrors to effectively shut down said second programmable analog block.

10. A programmable analog circuit having global and local power management comprising:

an array of programmable analog blocks that are coupled in parallel, including a first programmable analog block and a second programmable analog block;

said first programmable analog block including a first plurality of mirror circuits that are coupled in parallel for adjusting performance of said first programmable analog block, said first programmable analog block including a first operational amplifier, said first programmable analog block controlled by a first plurality of local configuration bits for selectively cutting in and removing mirror circuits in said first plurality of mirror circuits;

said second programmable analog block including a second plurality of mirror circuits that are coupled in parallel for adjusting performance of said second programmable analog block, said second programmable analog block including a second operational amplifier, said second programmable analog block controlled by a second plurality of local configuration bits for selectively cutting in and removing mirror circuits in said second plurality of mirror circuits;

a bias voltage for biasing said array of programmable analog blocks; and a plurality of global configuration bits for controlling said bias voltage for adjusting performance of said array of programmable analog blocks.

11. The programmable analog circuit as described in claim 10, wherein each of said first plurality of mirror circuits is a first plurality of current mirrors, and each of said second plurality of mirror circuits is a second plurality of current mirrors.

12. The programmable analog circuit as described in claim 10, further comprising a first combination of said plurality global configuration bits for increasing said bias voltage for adjusting performance of said array of programmable analog blocks.

13. The programmable analog circuit as described in claim 10, further comprising a second combination of said plurality of global configuration bits for decreasing said bias voltage for adjusting performance of said array of programmable analog blocks, said second combination of said plurality of global configuration bits including electrically disabling said array of programmable analog blocks.

14. The programmable analog circuit as described in claim 10, further comprising:

a first combination of said first plurality of local configuration bits for increasing current through said first operational amplifier for adjusting performance of said first programmable analog block by selectively enabling current mirrors in said first plurality of current mirrors; and a second combination of said second plurality of local configuration bits for increasing current through said second operational amplifier for adjusting performance of said second programmable analog block by selectively enabling current mirrors in said second plurality of current mirrors.

15. The programmable analog circuit as described in claim 10, further comprising:

a first combination of said first plurality of local configuration bits for decreasing current through said first operational amplifier for adjusting performance of said first programmable analog block by selectively disabling current mirrors in said first plurality of current mirrors, said first combination of said first plurality of local configuration bits including disabling all current mirrors in said first plurality of current mirrors to effectively shut down said first programmable analog block; and a second combination of said second plurality of local configuration bits for decreasing current through said second operational amplifier for adjusting performance of said second programmable analog block by selectively disabling current mirrors in said second plurality of current mirrors, said second combination of said second plurality of local configuration bits including disabling all current mirrors in said second plurality of current mirrors to effectively shut down said second programmable analog block.

16. The programmable analog circuit as described in claim 10, further comprising:

a microcontroller for controlling said plurality of global configuration bits, said first plurality of local configuration bits, and said second plurality of local configuration bits for providing local and global power management in said array of programmable analog blocks.

17. A method for performing local and global power management in a programmable analog circuit comprising the steps of:

asserting a plurality of global configuration bits for controlling a bias voltage for an array of programmable analog blocks coupled in parallel; and asserting a first plurality of local configuration bits for controlling a first plurality of current mirrors coupled in parallel that adjusts performance of a first operational amplifier in a first programmable analog block in said array of programmable analog blocks.

18. The method for performing local and global power management as described in claim 17, wherein step a) further comprises the steps of:

asserting a first combination of said plurality of global configuration bits for increasing said bias voltage.

19. The method for performing local and global power management as described in claim 17, wherein step a) further comprises the steps of:

asserting a first combination of said plurality of global configuration bits for decreasing said bias voltage, said first combination of said plurality of global configuration bits including disabling all current mirrors in said first plurality of current mirrors to effectively shut down said first programmable analog block.

20. The method for performing local and global power management as described in claim 17, wherein step b) further comprises the step of:

asserting a first combination of said first plurality of local configuration bits for increasing current through said first operational amplifier for adjusting performance of said first programmable analog block by selectively enabling current mirrors in said first plurality of current mirrors.

21. The method for performing local and global power management as described in claim 17, wherein step b) further comprises the step of:

asserting a first combination of said first plurality of local configuration bits for decreasing current through said first operational amplifier for adjusting performance of said first programmable analog block by selectively disabling current mirrors in said first plurality of current mirrors, said first combination of said first plurality of local configuration bits including disabling all current mirrors in said first plurality of current mirrors to effectively shut down said first programmable analog block.

22. The method for performing local and global power management as described in claim 17, comprising the further step of:

c) asserting a second plurality of local configuration bits for controlling a second plurality of current mirrors coupled in parallel that adjusts performance of a second operational amplifier in a second programmable analog block in said array of programmable analog blocks.

23. The method for performing local and global power management as described in claim 22, wherein step c) further comprises:

asserting a second combination of said second plurality of local configuration bits for increasing current through said second operational amplifier for adjusting performance of said second programmable analog block by selectively enabling current mirrors in said second plurality of current mirrors.

24. The method for performing local and global power management as described in claim 22, wherein step c) further comprises the step of:

asserting a second combination of said second plurality of local configuration bits for decreasing current through said second operational amplifier for adjusting performance of said second programmable analog block by selectively disabling current mirrors in said second plurality of current mirrors, said second combination of said second plurality of local configuration bits including disabling all current mirrors in said second plurality of current mirrors to effectively shut down said second programmable analog block.

\* \* \* \* \*